United States Patent
Lin et al.

(10) Patent No.: US 10,825,724 B2
(45) Date of Patent: Nov. 3, 2020

(54) METAL CONTACT STRUCTURE AND METHOD OF FORMING THE SAME IN A SEMICONDUCTOR DEVICE

(71) Applicant: Taiwan Semiconductor Manufacturing Company, Ltd., Hsin-Chu (TW)

(72) Inventors: Yu-Hung Lin, Taichung (TW); Sheng-Hsuan Lin, Zhubei (TW); Chih-Wei Chang, Hsin-Chu (TW); You-Hua Chou, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 14/262,467

(22) Filed: Apr. 25, 2014

(65) Prior Publication Data

US 2015/0311150 A1    Oct. 29, 2015

(51) Int. Cl.
*H01L 21/768*    (2006.01)
*H01L 23/532*    (2006.01)
(Continued)

(52) U.S. Cl.
CPC .. *H01L 21/76858* (2013.01); *H01L 21/28518* (2013.01); *H01L 21/76846* (2013.01); *H01L 21/76852* (2013.01); *H01L 21/76855* (2013.01); *H01L 21/76871* (2013.01); *H01L 21/76883* (2013.01); *H01L 21/76889* (2013.01); *H01L 23/485* (2013.01); *H01L 23/5226* (2013.01);
(Continued)

(58) Field of Classification Search
CPC ......... H01L 23/53238; H01L 21/76846; H01L 21/76852; H01L 21/76858; H01L 21/76871; H01L 21/76883; H01L 21/76889; H01L 23/5226

See application file for complete search history.

(56) References Cited

U.S. PATENT DOCUMENTS 6,624,516 B2 * 9/2003 Fujisawa et al. ........................... H01L 21/76846 257/751
8,017,523 B1 * 9/2011 Wu .................... H01L 21/2855 438/627

(Continued)

FOREIGN PATENT DOCUMENTS

| CN | 101312154 | 11/2008 |
| CN | 102184912 A | 9/2011 |
| CN | 103545292 | 1/2014 |

OTHER PUBLICATIONS

Liu, B.T. et al., "Ultrathin amorphous Ni—Ti film as diffusion barrier for Cu interconnection," Applied Surface Science, Jan. 15, 2011, vol. 257, Issue 7, Elsevier B.V., pp. 2920-2922.

(Continued)

*Primary Examiner* — Marcos D. Pizarro
(74) *Attorney, Agent, or Firm* — Slater Matsil, LLP

(57) ABSTRACT

A semiconductor device and method of formation are provided. The semiconductor device comprises a silicide layer over a substrate, a metal plug in an opening defined by a dielectric layer over the substrate, a first metal layer between the metal plug and the dielectric layer and between the metal plug and the silicide layer, a second metal layer over the first metal layer, and an amorphous layer between the first metal layer and the second metal layer.

20 Claims, 4 Drawing Sheets

(51) Int. Cl.
*H01L 21/285* (2006.01)
*H01L 23/485* (2006.01)
*H01L 23/522* (2006.01)

(52) U.S. Cl.
CPC .............. *H01L 23/53238* (2013.01); *H01L 2924/0002* (2013.01)

(56) References Cited

U.S. PATENT DOCUMENTS

| | | | | |
|---|---|---|---|---|
| 8,778,801 | B2* | 7/2014 | Chiang et al. | H01L 23/53238 257/E21.575 |
| 8,946,074 | B2* | 2/2015 | Koerner | H01L 21/28512 257/751 |
| 2002/0042193 | A1* | 4/2002 | Noguchi | H01L 21/02074 438/618 |
| 2010/0233876 | A1* | 9/2010 | Matsumoto | C23C 16/18 438/652 |
| 2011/0017499 | A1* | 1/2011 | Yang | H01L 21/76846 174/257 |
| 2012/0045893 | A1 | 2/2012 | Koerner | |
| 2015/0155239 | A1* | 6/2015 | Cohen | H01L 21/2855 257/751 |
| 2015/0187896 | A1* | 7/2015 | Kamineni | H01L 29/41791 257/288 |

OTHER PUBLICATIONS

Majumder, Prodyut, Fundamental Studies of Diffusion Barriers for Copper Metallization and Atomic Layer Deposited High-kappa Films, 2008, ProQuest, UMI Dissertations Publishing 2008, Ann Arbor, 219 pages.

Nogami, T. et al., "CVD Co and its application to Cu damascene interconnections," 2010 International Interconnect Technology Conference, Jun. 6-9, 2010, pp. 1-3.

\* cited by examiner

METAL CONTACT STRUCTURE AND METHOD OF FORMING THE SAME IN A SEMICONDUCTOR DEVICE

BACKGROUND

Semiconductor devices are used in a variety of electronic applications, such as personal computers, cell phones, digital cameras, and other electronic equipment, as examples. As technology has progressed, the demand for smaller semiconductor devices with improved performance has increased. As feature densities increase, the widths of the conductive lines, and the spacing between the conductive lines of interconnect structures also need to scale smaller.

Contacts are used to make electrical connections in or among different features in a semiconductor arrangement. A contact, for example, is used to connect one metal layer to another metal layer, where the metal layers are otherwise electrically isolated from one another, such as by an insulating or dielectric material separating the metal layers.

BRIEF DESCRIPTION OF DRAWINGS

Embodiments of the present disclosure are best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

In the following description, specific details are set forth to provide a thorough understanding of embodiments of the present disclosure. However, one having ordinary skill in the art will recognize that embodiments of the disclosure can be practiced without these specific details. In some instances, well-known structures and processes are not described in detail to avoid unnecessarily obscuring embodiments of the present disclosure.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are intended for illustration.

Figure 1:
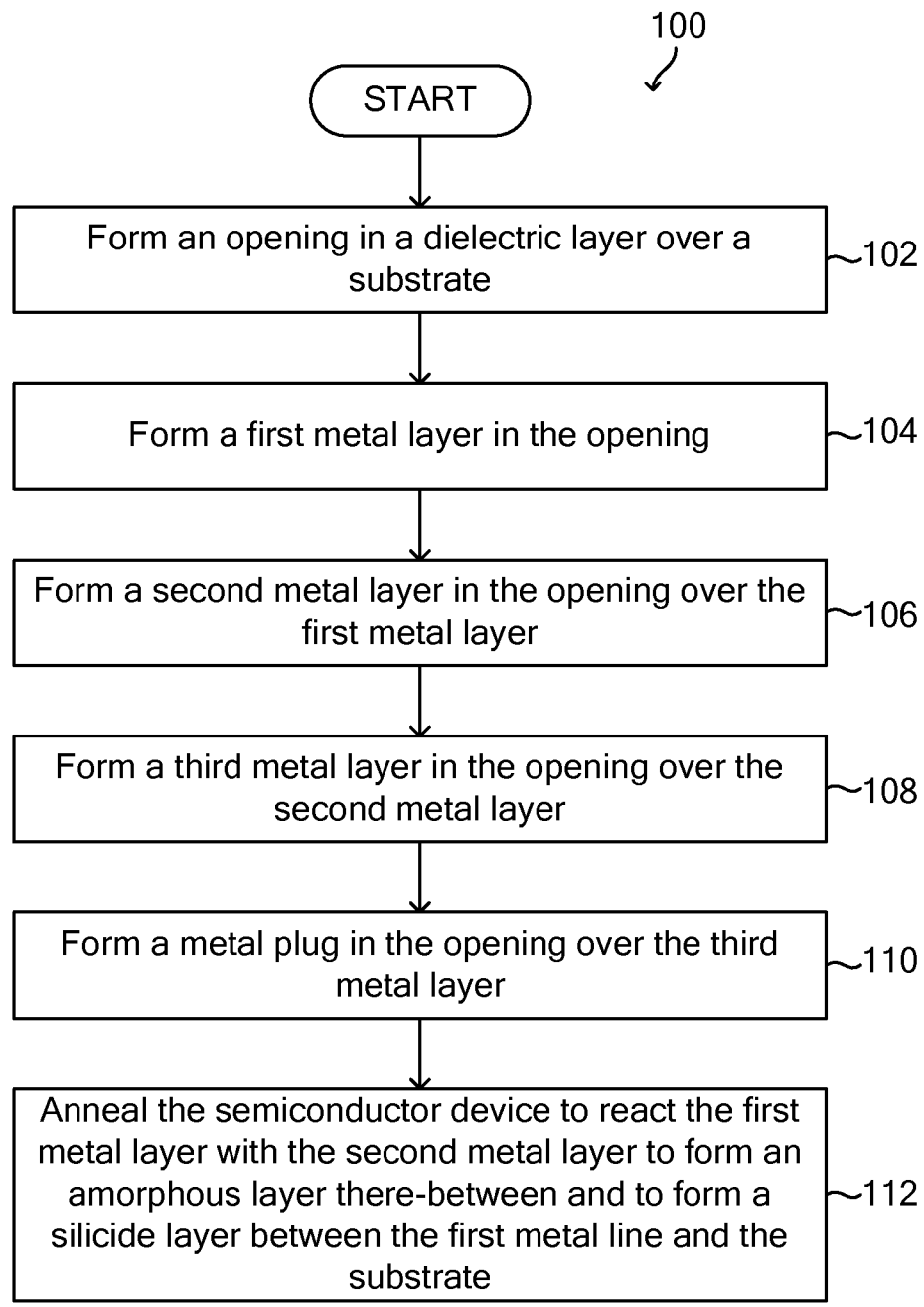
FIG. 1 is a flowchart illustrating a method for fabricating a semiconductor device, according to various aspects of the present disclosure.

FIG. 1 is a flowchart of a method 100 for fabricating a semiconductor device 200 according to various aspects of the present disclosure. FIGS. 2-6 show schematic cross-sectional views of a semiconductor device 200 at various stages of fabrication according to an embodiment of the method 1 of FIG. 1. The semiconductor device 200 may be included in a microprocessor, a memory cell, and/or other integrated circuit (IC). It is noted that the method of FIG. 1 does not produce a completed semiconductor device 200. A completed semiconductor device 200 may be fabricated using complementary metal-oxide-semiconductor (CMOS) technology process, for example. Accordingly, it is understood that additional processes may be provided before, during, and/or after the method 100 of FIG. 1, and that some other processes may only be briefly described herein. Also, FIGS. 1 through 6 are simplified for a better understanding of the present disclosure. For example, although the figures illustrate the semiconductor device 200, it is understood the IC may comprise a number of other devices comprising transistors, resistors, capacitors, inductors, fuses, etc.

Figure 2:
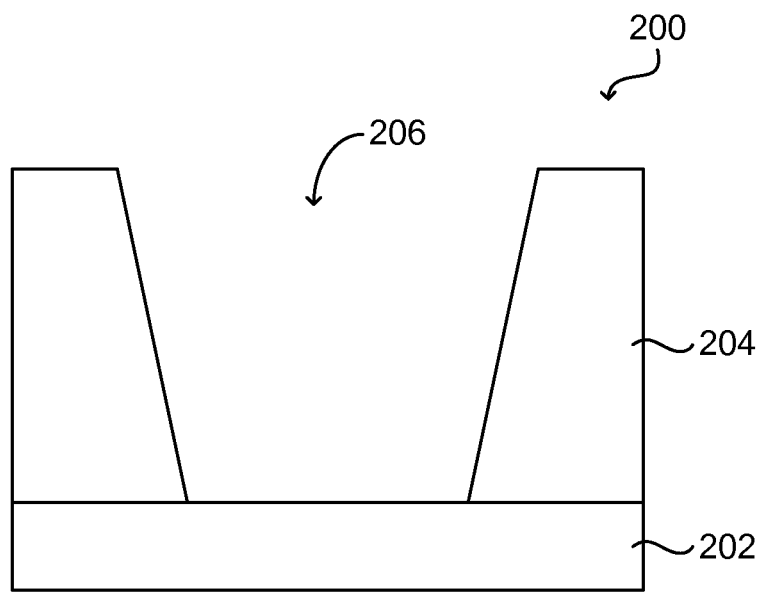
FIGS. 2-6 show schematic cross-sectional views of a semiconductor device at various stages of fabrication, according to various aspects of the present disclosure.

Referring to FIGS. 1 and 2, the method 100 begins at step 102 wherein an opening 206 is formed in a dielectric layer 204 over a substrate 202. In some embodiments, a silicide layer is formed under the dielectric layer 204 and over the substrate 202 in a front-end of line (FEOL) interconnect structure. The semiconductor substrate 202 is a substrate as employed in a semiconductor integrated circuit fabrication, and integrated circuits may be formed therein and/or thereupon. The term "semiconductor substrate" is defined to mean any construction comprising semiconductor material, for example, a silicon substrate with or without an epitaxial layer, a silicon-on-insulator (SOI) substrate containing a buried insulator layer, or a substrate with a silicon germanium layer. The term "integrated circuits" as used herein refers to electronic circuits having multiple individual circuit elements, such as transistors, diodes, resistors, capacitors, inductors, and other active and passive semiconductor devices. A conductive region formed in and/or on the semiconductor substrate 202 is a portion of conductive routes and has exposed surfaces that may be treated by a planarization process, such as chemical mechanical polishing. Suitable materials for the conductive regions may include, but not limited to, for example copper, aluminum, copper alloy, or other mobile conductive materials. Copper interconnect level may be the first or any subsequent metal interconnect level of the semiconductor device.

The dielectric layer 204 may be a single layer or a multi-layered structure. In some embodiments, the dielectric layer 204 has a thickness that varies with the applied technology, for example a thickness of about 1000 angstroms to about 30000 angstroms. In some embodiments, the dielectric layer 204 is silicon oxide, carbon-doped silicon oxide, a comparatively low dielectric constant (k value) dielectric material with a k value less than about 4.0, or combinations thereof. In some embodiments, the dielectric layer 204 is formed of a material, including low-k dielectric material, extreme low-k dielectric material, porous low-k dielectric material, and combinations thereof. The term "low-k" is intended to define a dielectric constant of a dielectric material of 3.0 or less. The term "extreme low-k (ELK)" means a dielectric constant of 2.5 or less, and preferably between 1.9 and 2.5. The term "porous low-k" refers to a dielectric constant of a dielectric material of 2.0 or less, and preferably 1.5 or less. A wide variety of low-k materials may be employed in accordance with embodiments, for example, spin-on inorganic dielectrics, spin-on organic dielectrics, porous dielectric materials, organic polymer, organic silica glass, FSG (SiOF series material), HSQ (hydrogen silsesquioxane) series material, MSQ (methyl silsesquioxane) series material, or porous organic series material. In some embodiments, the dielectric layer 206 is deposited through any of a variety of techniques, such as chemical vapor deposition (CVD), physical vapor deposition (PVD), atomic layer deposition (ALD), remote plasma enhanced chemical vapor deposition (RPECVD), liquid source misted chemical deposition (LSMCD), coating, spin-coating or another process that is adapted to form a thin film layer over the substrate.

The opening 206 is an exemplary single damascene opening patterned in the dielectric layer 204. The opening 206 may be formed via etching. In some embodiments, the opening 206 is formed using a wet etching process. In other embodiments, the opening 206 is formed using a dry etching process.

Figure 3:
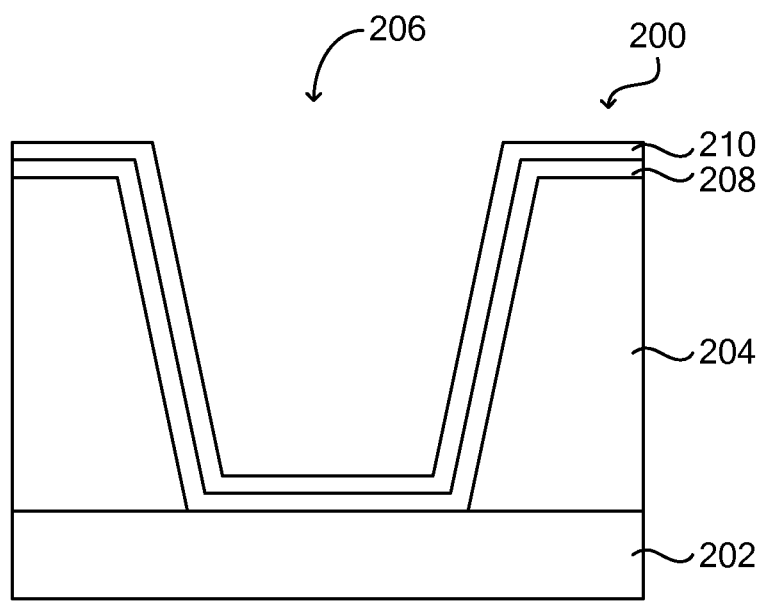

Referring to FIGS. 1 and 3, the method 100 proceeds to step 104 wherein a first metal layer 208 is formed in the opening 206 to line the sidewalls and bottom of the opening 206 and over the dielectric layer 204. In a later thermal anneal process, the first metal layer 208 reacts with silicon in the active region of the semiconductor device 200 to form a silicide contact layer 216 (see FIG. 6). In some embodiments, the first metal layer 208 comprises cobalt (Co). In other embodiments, the first metal layer 208 comprises nickel (Ni). Cobalt reacts with the silicon in the active regions (e.g., source, drain, and gate) of the semiconductor device 200 to form cobalt silicide ($CoSi$, $Co_2Si$, $CoSi_2$). Cobalt silicide has a sufficiently low resistance to form an effective electrical contact between the transistor active regions of silicon and the metal plug, such as a copper plug. A cobalt silicide contact is also easier to form, especially in deep submicron geometries of 0.18 μm and less because of the smaller grain size compared to the grain size of $TiSi_2$. In some embodiments, the first metal layer 208 has a thickness ranging from about 30 angstroms to about 250 angstroms. In some embodiments, the first metal layer 208 is deposited by physical vapor deposition (PVD), chemical vapor deposition (CVD), plasma-enhanced CVD (PECVD), low pressure CVD (LPCVD), or other well-known deposition techniques.

Referring now to FIGS. 1 and 3, the method 100 proceeds to step 106 wherein a second metal layer 210 is formed in the opening 206 over the first metal layer 208. The second metal layer 210 may function as a metal diffusion barrier layer to prevent copper diffusion from a copper plug into an underlying silicide layer. This diffusion occurs during heat treatment of the semiconductor device 200 where copper diffuses to the silicide layer, which then reduces the reliability of the semiconductor device 200. In some embodiments, in a later thermal anneal process, the second metal layer 210 reacts with the first metal layer 208 to form an amorphous layer 218 there-between (see FIG. 6). The amorphous layer 218 prevents copper diffusion to the silicide layer and improves thermal stability of the semiconductor device 200. In some embodiments, the second metal layer 210 comprises tantalum (Ta). In some embodiments, the second metal layer 210 comprises titanium (Ti). In other embodiments, the second metal layer 210 comprises tantalum (Ta). In some embodiments, the second metal layer 210 has a thickness ranging from about 20 angstroms to about 200 angstroms. In some embodiments, the second metal layer 210 is deposited by physical vapor deposition (PVD), chemical vapor deposition (CVD), plasma-enhanced CVD (PECVD), low pressure CVD (LPCVD), or other well-known deposition techniques.

Figure 4:
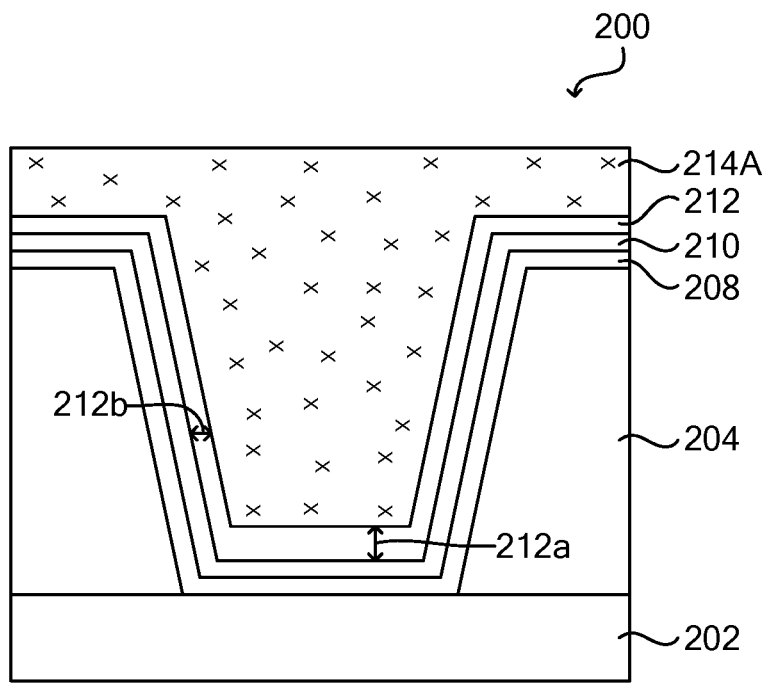

Referring to FIGS. 1 and 4, the method 100 proceeds to step 108 wherein a third metal layer 212 is formed in the opening 206 over the second metal layer 210. The third metal layer 212 may function as a barrier to prevent a subsequently formed conductor, such as a copper plug from diffusing into the underlying dielectric layer 204. The third metal layer 212 may also function as a gap filling improvement layer whereby the third metal layer 212 has a sidewall thickness less than the bottom thickness, thus avoiding voids that may otherwise form in high aspect ratio geometries. In some embodiments, the third metal layer 212 includes cobalt (Co), ruthenium (Ru) or combinations thereof. Cobalt, for instance has a resistivity of about 62.4 nΩ-m at 20 degrees Celsius, which is lower than the resistivity of typical diffusion barrier layers including Ta, Ti, W, or TaN barrier layers. Therefore, a low resistance of the conformal protective layer 212 can be achieved to decrease a RC delay issue.

In some embodiments, the third metal layer 212 is deposited conformally above the second metal layer 210 by using chemical vapor deposition (CVD), atomic layer deposition (ALD) or other well-known conformal deposition techniques. As indicated above, the third metal layer 212 is conformally deposited to avoid a gap filling issue during subsequent opening filling process. In some embodiments, the third metal layer 212 is deposited on a sidewall of the second metal layer 210 at a sidewall thickness 212b ranging from about 10 angstroms to about 50 angstroms. In some embodiments, the third metal layer 212 is deposited on a bottom of the second metal layer 210 at a bottom thickness 212a ranging from about 10 angstroms to about 200 angstroms.

Still referring to FIGS. 1 and 4, a conductor 214A is formed over the third metal layer 212 to fill the opening 206. In some embodiments, the conductor is formed as a metal plug in a front-end of line (FEOL) interconnect structure. In some embodiments, the conductor 214A is deposited by an electro-chemical plating (ECP) process. In some embodiments, the conductor 214A at least contains the main metal element, e.g., copper (Cu). In some embodiments, the conductor 214A further contains an additive metal element such as tantalum, indium, tin, zinc, manganese, chromium, titanium, germanium, strontium, platinum, magnesium, aluminum, or zirconium.

In some embodiments, a conductive seed layer (not shown) is formed before forming the conductor 214A. In some embodiments, the conductive seed layer contains a pure metal, such as copper. In some embodiments, the conductive seed layer at least contains the main metal element, e.g., copper (Cu), as contained in the conductor 214A. In some embodiments, the conductive seed layer is a copper-containing layer, such as CuAl, CuMn, or the like. In some embodiments, the conductive seed layer is formed by using physical vapor deposition (PVD) or other well-known deposition techniques. In some embodiments, the conductive seed layer has a thickness of about 100 angstroms to about 450 angstroms.

Figure 5:
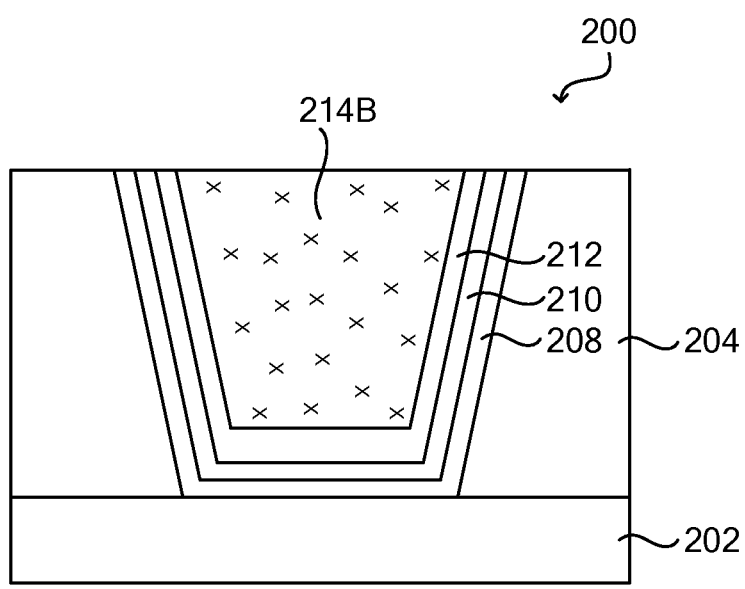

Referring to FIGS. 1 and 5, the method 100 proceeds to step 110 wherein the portion of the conductor 214A over the dielectric layer 204 is removed to form a metal plug 214B. In some embodiments, the removing process is chemical mechanical polishing (CMP) process performed to remove the excess portions of the conductor 214A, the third metal layer 212, the second metal layer 210 and the first metal layer 208 outside the opening 206, thus exposing a top surface of the dielectric layer 204 and achieving a planarized surface. In some embodiments, the metal plug 214B is a copper plug.

Figure 6:
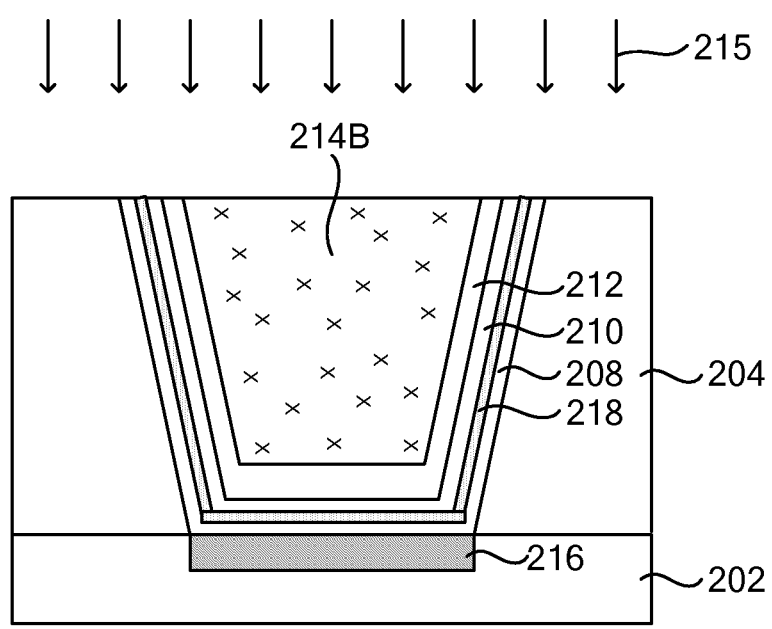

Referring to FIGS. 1 and 6, the method 100 proceeds to step 112 wherein a thermal treatment 215 is performed on the semiconductor device 200. In some embodiments, the thermal treatment 215 includes an annealing process. In one embodiment, the thermal treatment 215 is performed at a temperature ranged from about 200 degrees Celsius to about 800 degrees Celsius. In one embodiment, the thermal treatment 215 is performed at a duration ranged from about 20 seconds to about 1,000 seconds. In one embodiment, the thermal treatment 215 is performed under an argon (Ar) gas environment in a pressure ranged from about 770 Torr to about 850 Torr. In some embodiments, the thermal treatment 215 is performed using a rapid thermal anneal (RTA) process, a chemical vapor deposition (CVD) process, hot plate equipment, or any of a variety of heat treatment techniques.

During and/or after the thermal process, in some embodiments, the first metal layer 208 reacts with silicon in the active region of the semiconductor device 200 to form a silicide layer 216. In some embodiments, the cobalt (Co) in the first metal layer 208 partially or completely diffuses into silicon in the active regions (e.g., source, drain, and gate) of the substrate 202. In some embodiments, the diffused cobalt reacts with silicon to form cobalt silicide (CoSi, $Co_2Si$, $CoSi_2$). Cobalt silicide has a sufficiently low resistance to form an effective electrical contact between the transistor active regions of silicon and the metal plug 214B. In some embodiments, the nickel (Ni) in the first metal layer 208 partially or completely diffuses into silicon in the active regions. In some embodiments, the diffused nickel reacts with silicon to form nickel silicide (NiSi). In one embodiment, the silicide layer 216 has a thickness ranging from about 30 angstroms to about 200 angstroms.

During and/or after the thermal treatment 215, in some embodiments, the second metal layer 210 reacts with the first metal layer 208 to form an amorphous layer 218 between the first metal layer 208 and the second metal layer 210. Due to the amorphous layer 218 not having a grain boundary, the amorphous layer 218 prevents copper diffusion from copper plug 214B to the silicide layer 216 and also improves thermal stability of the semiconductor device 200. In some embodiments, the amorphous layer 218 comprises Co—Ta, Co—Ti, Ni—Ta, Ni—Ti, or combinations thereof. In some embodiments, the amorphous layer 218 has a thickness ranging from about 3 angstroms to about 30 angstroms.

Further processing may be performed. For example, additional dielectric layers and metallization layers may be formed to interconnect various elements, contact pads and passivation layers may be formed, and the like to complete the semiconductor device 200.

Advantages of one or more embodiments of the present disclosure may include one or more of the following.

In one or more embodiments, the silicide layer containing cobalt silicide or nickel silicide has a sufficiently low resistance to form an effective electrical contact between the transistor active regions of the substrate and the copper plug.

In one or more embodiments, the amorphous layer prevents copper diffusion to the silicide layer and improves thermal stability of the semiconductor device.

In one or more embodiments, the third metal layer is conformally deposited in a via opening, gap filling issues are avoided during subsequent opening filling process.

In one or more embodiments, the third metal layer includes cobalt or ruthenium having a low resistivity to decrease contact resistance and RC delay issues thereby improving device performance.

Various aspects of the present disclosure have been described. According to one aspect of this description, a semiconductor device is provided. The semiconductor device includes a silicide layer over a substrate, a metal plug in an opening defined by a dielectric layer over the substrate, and a first metal layer between the metal plug and the dielectric layer and between the metal plug and the silicide layer. The device also includes a second metal layer over the first metal layer, and an amorphous layer between the first metal layer and the second metal layer.

According to another aspect of this description, a semiconductor device includes a cobalt (Co) or nickel (Ni) layer in an opening defined by a dielectric layer over a substrate comprising silicon. The device also includes a copper diffusion barrier layer over the cobalt or nickel layer, an amorphous layer between the cobalt or nickel layer and the copper diffusion barrier layer, a metal plug comprising copper in the opening, and a silicide layer between the metal plug and the substrate, the silicide layer comprising cobalt silicide (CoSi) or nickel silicide (NiSi).

According to yet another aspect of this description, a method of forming a semiconductor device includes forming a first metal layer in an opening defined by a dielectric layer over a substrate. A second metal layer is formed in the opening over the first metal layer. A third metal layer is formed in the opening over the second metal layer. A metal plug is formed in the opening over the third metal layer. The semiconductor device is subject to a heat treatment to react the first metal layer with the second metal layer to form an amorphous layer there-between and to form a silicide layer between the first metal line and the substrate.

In the preceding detailed description, various embodiments have been described. It will, however, be apparent to a person of ordinary skill in the art that various modifications, structures, processes, and changes may be made thereto without departing from the broader spirit and scope of the present disclosure. The specification and drawings are, accordingly, to be regarded as illustrative and not restrictive. It is understood that embodiments of the present disclosure are capable of using various other combinations and environments and are capable of changes or modifications within the scope of the claims and their range of equivalents.

What is claimed is:

1. A semiconductor device comprising:
   a substrate comprising silicon;
   a dielectric layer formed over the substrate with an opening defined in the dielectric layer;
   a first metal layer formed in the opening, the first metal layer extending from a bottom surface of the dielectric layer to a top surface of the dielectric layer;
   a silicide layer formed between the substrate and the first metal layer, the silicide layer comprising a silicide portion of the first metal layer;
   an amorphous layer formed over the first metal layer, the amorphous layer comprising an amorphized portion of the first metal layer, the amorphous layer comprising Ni—Ta;
   a second metal layer formed in the opening over the amorphous layer, wherein the amorphous layer comprises a metal of the first metal layer and a metal of the second metal layer; and
   a third metal layer formed over the second metal layer, wherein the third metal layer is a metal diffusion barrier layer and has a sidewall and a bottom wall, wherein a thickness of the sidewall is between about 10 and 50 angstroms, and wherein a thickness of the bottom wall is between about 10 and 200 angstroms, an entirety of the bottom wall having a uniform thickness, and an entirety of the sidewall having a uniform thickness, wherein top surfaces of the dielectric layer, the first metal layer, the amorphous layer, the second metal layer, and the third metal layer are co-planar.

2. The semiconductor device of claim 1, wherein the first metal layer lines a bottom and sidewalls of the opening.

3. The semiconductor device of claim 1 further comprising a metal plug positioned in the opening over the third metal layer.

4. The semiconductor device of claim 3, wherein the metal plug fills the opening.

5. A semiconductor device comprising:
a cobalt (Co) layer in an opening defined by a dielectric layer over a substrate comprising silicon;
a copper diffusion barrier layer over the cobalt layer;
an amorphous layer between the cobalt layer and the copper diffusion barrier layer, wherein the amorphous layer comprises a first metal of the copper diffusion barrier layer and a second metal of the cobalt layer, the second metal being cobalt, wherein the amorphous layer comprises Co—Ti;
a metal plug comprising copper in the opening;
a silicide layer between the metal plug and the substrate, the silicide layer comprising the second metal of the cobalt layer, the silicide layer comprising cobalt silicide (CoSi), the cobalt layer physically contacting the silicide layer; and
a ruthenium (Ru) layer between the metal plug and the copper diffusion barrier layer, wherein the ruthenium layer has a sidewall thickness and a bottom thickness, the sidewall thickness being on a side surface of the copper diffusion barrier layer, the bottom thickness being on a top surface of the copper diffusion barrier layer, the top surface the of the copper diffusion barrier layer being between side surfaces of the copper diffusion barrier layer, the bottom thickness of the ruthenium layer being uniform across an entire top surface of the copper diffusion barrier layer, wherein top surfaces of the cobalt layer, the copper diffusion barrier, the amorphous layer, the ruthenium layer, and the metal plug are level with one another.

6. The semiconductor device of claim 5, wherein the copper diffusion barrier layer comprises titanium (Ti).

7. The semiconductor device of claim 5, wherein the metal plug further comprises zirconium.

8. The semiconductor device of claim 5, wherein the metal plug further comprises germanium.

9. The semiconductor device of claim 5, wherein the metal plug further comprises indium.

10. A semiconductor device comprising:
a silicide layer over a substrate;
a metal plug in an opening defined by a dielectric layer over the substrate;
a first metal layer between the metal plug and the dielectric layer and between the metal plug and the silicide layer, the first metal layer being a first metal material, wherein the silicide layer comprises the first metal material, the first metal layer lining sidewalls of the dielectric layer, a top surface of the first metal layer being substantially level with a top surface of the dielectric layer, a bottom surface of the first metal layer being substantially level with a bottom surface of the dielectric layer;
a second metal layer over the first metal layer, the second metal layer being a second metal material;
an amorphous layer between the first metal layer and the second metal layer, wherein the amorphous layer comprises the first metal material and the second metal material, a top surface of the amorphous layer being substantially level with the top surface of the first metal layer, the amorphous layer comprising Ni—Ta;
a third metal layer over the second metal layer, wherein the third metal layer is a metal diffusion barrier layer and has a sidewall and a bottom wall, and wherein a thickness of the sidewall is less than a thickness of the bottom wall, the bottom wall having a uniform thickness across an entirety of the bottom wall, the sidewall having a uniform thickness across an entirety of the sidewall; and
a seed layer between the third metal layer and the metal plug.

11. The semiconductor device of claim 10, wherein the first metal layer comprises nickel (Ni).

12. The semiconductor device of claim 10, wherein the first metal layer has a thickness ranging from about 30 angstroms to about 250 angstroms.

13. The semiconductor device of claim 10, wherein the silicide layer comprises nickel silicide (NiSi) and has a thickness ranging from about 30 angstroms to about 200 angstroms.

14. The semiconductor device of claim 10, wherein the second metal layer has a thickness ranging from about 20 angstroms to about 200 angstroms.

15. The semiconductor device of claim 10, wherein the metal plug comprises copper.

16. The semiconductor device of claim 10, wherein the third metal layer comprises cobalt (Co), ruthenium (Ru), or combinations thereof.

17. The semiconductor device of claim 10, wherein the seed layer comprises CuMn, and wherein the seed layer has a thickness from 100 angstroms to 450 angstroms.

18. The semiconductor device of claim 10, wherein the substrate comprises silicon.

19. The semiconductor device of claim 10, wherein the second metal layer is a metal diffusion barrier layer.

20. The semiconductor device of claim 19, wherein the metal diffusion barrier layer comprises tantalum (Ta).

* * * * *